(12) United States Patent
Lagha et al.

(10) Patent No.: US 8,183,160 B2
(45) Date of Patent: May 22, 2012

(54) METHOD FOR MANUFACTURING A SEMICONDUCTOR DEVICE AND SEMICONDUCTOR DEVICE OBTAINABLE WITH SUCH A METHOD

(75) Inventors: Anissa Lagha, Montbonnot (FR); Robert Fox, Singapore (SG); Lucile Broussous, Goncelin (FR); Didier Levy, Saint Nazaire les Eymes (FR)

(73) Assignees: Freescale Semiconductor, Inc., Austin, TX (US); ST Microelectronics (Crolles 2) SAS, Crolles (FR)

( * ) Notice: Subject to any disclaimer, the term of this patent is extended or adjusted under 35 U.S.C. 154(b) by 229 days.

(21) Appl. No.: 12/681,119

(22) PCT Filed: Oct. 9, 2007

(86) PCT No.: PCT/IB2007/055367
§ 371 (c)(1),
(2), (4) Date: Apr. 1, 2010

(87) PCT Pub. No.: WO2009/047588
PCT Pub. Date: Apr. 16, 2009

(65) Prior Publication Data
US 2010/0225003 A1    Sep. 9, 2010

(51) Int. Cl.
*H01L 21/311* (2006.01)
(52) U.S. Cl. ........ 438/700; 438/629; 438/667; 438/672; 257/E21.585; 257/758; 257/774
(58) Field of Classification Search ........... 257/E21.585, 257/E23.011, 773–776, 758; 438/639, 689, 438/629, 637, 640, 667, 668, 672, 675, 700, 438/701, 713, 978
See application file for complete search history.

(56) References Cited

U.S. PATENT DOCUMENTS

| | | | | | |
|---|---|---|---|---|---|
| 5,547,896 | A | * | 8/1996 | Linn et al. | 438/384 |
| 5,981,380 | A | * | 11/1999 | Trivedi et al. | 438/639 |
| 6,020,621 | A | * | 2/2000 | Wu | 257/506 |
| 6,251,746 | B1 | * | 6/2001 | Hong et al. | 438/424 |
| 6,316,329 | B1 | * | 11/2001 | Hirota et al. | 438/424 |
| 6,391,729 | B1 | * | 5/2002 | Hui | 438/296 |
| 6,461,937 | B1 | * | 10/2002 | Kim et al. | 438/431 |

(Continued)

FOREIGN PATENT DOCUMENTS
WO    2007/044446 A    4/2007

OTHER PUBLICATIONS

Delgadino, Gerardo et al: "Tungsten Hard Mask Damascene Integration Scheme for 65nm" Applied Materials Inc., Santa Clara, CA 95054 USA, Oct. 6, 2004.

Furusawa, Takeshi et al: "Dual-Damascene Cu/Low-k Interconnect Fabrication Scheme Using Dissoluble Hard Mask Material" Journal of the Electrochemical Society, 153 (2) Pages, G160-G163, 2006.

(Continued)

Primary Examiner — Chris Chu

(57) ABSTRACT

A method for manufacturing a semiconductor device includes providing a patterned hard-mask layer. The hard-mask layer is provided on an exposed surface of one or more layers to be patterned of a semiconductor intermediate product. The hard-mask layer covers the exposed surface in covered areas of the one or more layers to be patterned and does not cover the exposed surface in bared areas of the one or more layers to be patterned. One or more recesses are formed in the layers to be patterned by at least partially removing the layers to be patterned in the bared areas. The hard-mask layer is ten removed. After removing the hard-mask layer the recess is filled with a filling material.

20 Claims, 3 Drawing Sheets

U.S. PATENT DOCUMENTS

| | | | | |
|---|---|---|---|---|
| 6,468,853 B1 * | 10/2002 | Balasubramanian et al. | | 438/221 |
| 6,723,617 B1 * | 4/2004 | Choi | | 438/424 |
| 6,974,755 B2 * | 12/2005 | Ko et al. | | 438/424 |
| 7,588,996 B2 * | 9/2009 | Yoon et al. | | 438/444 |
| 7,745,304 B2 * | 6/2010 | Lim | | 438/424 |
| 7,863,137 B2 * | 1/2011 | Lee et al. | | 438/270 |
| 2003/0044725 A1 | 3/2003 | Hsue et al. | | |
| 2004/0219796 A1 | 11/2004 | Wu | | |
| 2006/0024948 A1 | 2/2006 | Oh et al. | | |

OTHER PUBLICATIONS

Weng, Mei Qi et al: "Metal Hard Mask Employed Cu/Low k Post Etch Resist Ash/Wet Clean Process Optimization and Integration into 65nm Manufacturing Flow" Applied Materials, Sunnyvale, CA 94085 USA, pp. 75-76, 2006.

International Search Report and Written Opinion correlating to PCT/IB2007/055367 dated Jun. 2, 2008.

* cited by examiner

A

B

C

D

E

F

G

H

I

J

K

METHOD FOR MANUFACTURING A SEMICONDUCTOR DEVICE AND SEMICONDUCTOR DEVICE OBTAINABLE WITH SUCH A METHOD

FIELD OF THE INVENTION

This invention relates to a method for manufacturing a semiconductor device and to a semiconductor device obtainable with such a method.

BACKGROUND OF THE INVENTION

In the manufacture of integrated circuits (ICs) of semiconductor devices, a variety of (semi)conductive device regions and layers are formed on a device substrate, generally segregated by electrically insulating dielectric regions and layers. In the manufacture of the IC, one or more layers may be patterned to, for example, create openings in the dielectric layers. In the openings (semi)conducting material(s) can be provided to permit contact and electrical communication between different regions of the IC. To form such openings, a photo-resist is patterned using photolithography over the dielectric layer, creating regions in which the dielectric layers is bared and can be removed, for example by exposure to a suitable etching medium.

However, the photo-resist layer may degrade during the removal of the dielectric material, for example because the etching medium affects the photo-resist, thereby reducing the resolution of the image patterned into the dielectric layer. In order to reduce the amount of imperfections in the image transfer from the resist layer to the underlying dielectric layer, it is known to interpose a layer of an inorganic material, known as a hard-mask, between the dielectric layer and resist layers. A photo-resist is then coated over the hard-mask and patterned to expose regions of the hard-mask. The hard-mask regions bared after patterning the photo-resist are then removed by exposure to a suitable process, such as a plasma etch, to which the photo-resist layer is resistant. Thereby, the hard-mask is patterned corresponding to the pattern of the photo-resist and hence the pattern is transferred from the photo-resist into the hard-mask. The regions of dielectric layer that are exposed after the patterning of the hard-mask are then removed, for example by etching or another process that is selective for the dielectric and to which the hard-mask is resistant.

However, a problem is that the hard-mask material may interact with other compounds present in the environment or residues at the surface. This may lead to the presence of residues which adversely affect the resolution of the image patterned into the dielectric layer. For example, the resolution of the resulting image, patterned into the dielectric layer may be affected because of filling issues. Also, unwanted residues may be growing after the dielectric etching and affect filing of the trenches. From Mei Qi Weng et al., "Metal Hard-mask employed Cu/Low k Post Etch Resist Ash/Wet Clean, Process optimization and Integration into 65 nm Manufacturing Flow", Proceedings of the Eighth International Symposium on Ultra-Clean Processing of Silicon Surfaces UCPSS 2006, a wafer cleaning process is disclosed. The process includes the removal of organometalic residue and metal fluorite compounds caused by the presence of a metal hard-mask in a copper/low-K process. After etching the interconnect trenches, the hard-mask is slightly etched to remove the organometalic residue and is subject to a fluoride based aqueous chemical to dissolve the metal fluoride particles and hence remove the metal fluoride.

However, a disadvantage of this method is that it does not prevent re-growth of the metal fluoride particles or other contamination when substances are present in the environment with which the hard-mask may react.

SUMMARY OF THE INVENTION

The present invention provides a method for manufacturing a semiconductor device and a semiconductor device as described in the accompanying claims.

Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

DETAILED DESCRIPTION OF THE PREFERRED EMBODIMENTS

Figure 1:
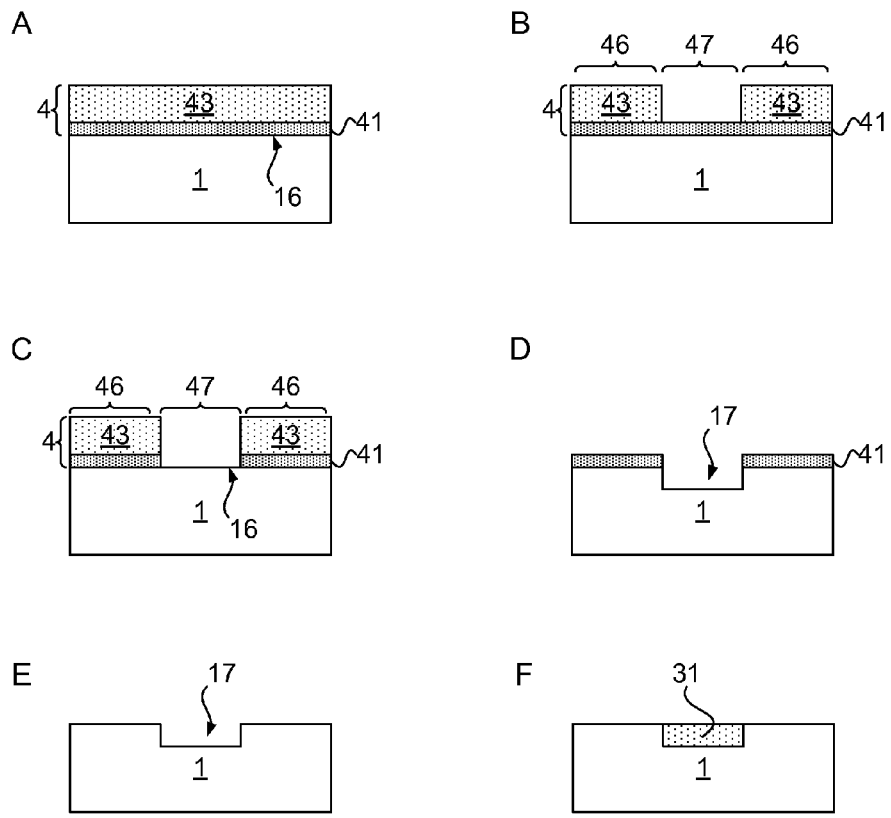
FIGS. 1A-1F schematically show cross-sectional views of an example of an embodiment of a semiconductor intermediate product in different stages of a first example of a method for manufacturing a semiconductor device.

FIG. 1 illustrates a method for manufacturing a semiconductor device. As shown in FIG. 1A. an intermediate product 1 in the manufacturing of a semiconductor device, from hereon referred to as a semiconductor intermediate product 1, may be provided. On an, initially exposed, surface 16 of one or more layers to be patterned of the semiconductor intermediate product, a hard-mask 41 may be provided. As illustrated in FIGS. 1A and 1B, the hard-mask layer 41 may be patterned. The hard-mask layer 41 may for example be patterned by covering the hard-mask layer 41 with a protective layer 43. The protective layer 43 may be patterned such that in covered areas 46 the hard-mask layer 41 is covered and such that in bared areas 47 the hard-mask layer 41 is bared, as is shown in FIG. 1B. The protective layer 43 may for example be a resist layer which is patterned using a suitable lithography process, such as photolithography, electron-beam lithography, imprint lithography or other suitable patterning process.

As illustrated in FIG. 10, the hard-mask layer 41 may be removed in the bared areas 47. The hard-mask layer 41 may for example be exposed in the bared areas 47 to a substance, such as a suitable wet or dry etchant or solvent, which removes the hard-mask material. As shown, the substance may for example be selective to the hard-mask material and not significantly affect the resist 43 or the semiconductor device layer.

However, the substance may remove a part of the resist layer 43, and for example reduce the overall thickness thereof. For example, the initial thickness of the resist later 43 may exceed the amount of thickness removed by the substance during the period of time the hard-mask layer is exposed to the substance, thus preventing the hard-mask from being exposed to the substance in the covered areas 46.

As shown in FIG. 1C, after the hard-mask layer 41 has been patterned, for example after transfer of the pattern in the resist layer 43 to the hard-mask layer 41, the exposed surface 16 is covered by the hard-mask layer in the covered areas 46 and the exposed surface 16 is bared, i.e. the hard-mask 41 does not cover the exposed surface 16, in the bared areas 47. The resist layer 43 may then be removed.

As shown in FIG. 1D, one or more recesses 17 may be formed in one or more of the layers to be patterned by at least partially removing respective layers in the bared areas 47. For example, the recesses 17 may be formed by exposed in the bared areas 47 to a substance, such as a suitable wet or dry etchant or solvent, which removes the material of the semiconductor devices layer(s). As shown, the substance may for example be selective to the semiconductor devices layer(s) and not significantly affect the hard-mask material.

After formation of the recess(es) 17, the hard-mask layer 41 may be removed, as illustrated in FIG. 1E. Thereby, the risk that residues, such as fluoride crystals or organometallic particles, formed by the interaction of the hard-mask layer 41 with its environment, for example with reactive fluor or organic compounds, are included in the semiconductor device structure may be reduced and the further formation of such residues may be prevented.

After the removal of the hard-mask layer 41, the recess 17 may be filled with a filling material 31, as illustrated in FIG. 1F. After filling the recess 17 with the filling material 31, the semiconductor intermediate product 1 may be processed further to obtain a semiconductor device. For example, after the filling the recess 17 with the filling material 31, a top surface of the semiconductor intermediate product (exposed layer 16 in the example of FIG. 2) may be subject to a treatment such as planarisation or polishing, further layers may be deposited on top of the patterned semiconductor device layer or other processing may be performed to obtain a semiconductor device.

The hard-mask layer 41 may be formed in any manner suitable for the specific implementation and be made from any suitable hard-mask material. The hard-mask material may for example be a metal (such as aluminium, copper, titanium, tantalum, tungsten or analogues, mixtures, compounds and/or alloys thereof) or a metal-compound, (such as a metal-nitride, for example TiN, TaN or HfN or analogues, mixtures, compounds and/or alloys thereof) or other inorganic or organometallic compounds (such as poly-silicon, silicon nitride, siliconoxide or analogues, mixtures, compounds and/or alloys thereof). The hard-mask layer may for example be formed by sputtering, vapour deposition or other suitable techniques.

The hard-mask layer 41 may be removed using any suitable process. For example, the hard-mask layer 41 may be exposed to an etchant, such as a wet etchant or a dry etchant. The etchant may be selective to the hard-mask layer 41 and not etch the dielectric layer 15 or the filling material 31.

Suitable substances for removing the hard-mask layer 41 are, for example, wet echtants containing peroxyde ($H_2O_2$) or a mixture of $H_2O_2$, $NH_4OH$, and $H_2O$ (such as SC1) or a mixture of HCl, $H_2O_2$ and $H_2O$ (such as SC2) for the removal of a hard-mask with Ti, TiN, W, AlCu, Co, TiW or W. Heating of such wet etchants to temperature well above room temperature (e.g between 15 and 30° C.), such as above 50° C., for example to 90° C. or more, such as 95° C. has found to provide good results for etching those materials. For example, hot peroxide at a temperature higher than 50° C. or a mixture of $H_2O$ and one or more of: $H_2O_2$, $NH_4OH$, and HCl, may be used to remove a layer of Ti, TiN, W, AlCu, Co, TiW, for example with a concentration of $H_2O_2$ of 30 volume % and/or a concentration of $NH_4OH$ of 28 volume %, and/or a concentration of HCl of 37 volume %.

A semi-aqueous substance, such as the one as manufactured by ATMI Gmbh of Unterhaching, Germany and marketed under the name of AP-950, including a dissolution of organic residuals, inorganic salts, fluorine salts (such as $NH_4F$ and $NH_4HF_2$), $H_2O_2$, corrosion inhibitors, metals complexants, buffers, surfactants, and 2-(2-butoxyethoxy) ethanol such may be used to remove TiN. Water with 5 wt % HF has been found to be a suitable wet etchant for Al, Ti, TiN, AlCu, Co, and TiW hard-masks while a solution with HF:HCl in a ratio of 6:1 may be used to remove Ta and TaN hard-masks.

The hard-mask layer 41 may be used to pattern any suitable type of layer of a semiconductor intermediate product. For example, the hard-mask layer may be used to pattern semiconductor layer(s), such as a poly-silicon layer or a substrate layer of a semiconductor device structure during the formation of the actual semiconductor device structure, for example to form a contact of the semiconductor device structure. The layer to be patterned may for example be a dielectric layer. However, it will be apparent that a hard-mask may also be used to pattern other types of layers of a semiconductor intermediate product. For example, the hard-mask may be used to pattern a layer in the Back end of line (BEOL) phase, that is the phase of the fabrication of the semiconductor device after fabrication of the active components (transistors, resistors, etc.). For example, the hard-mask may be used to pattern vias or interconnects in a layer after the actual semiconductor devices have been manufactured.

Figure 2:
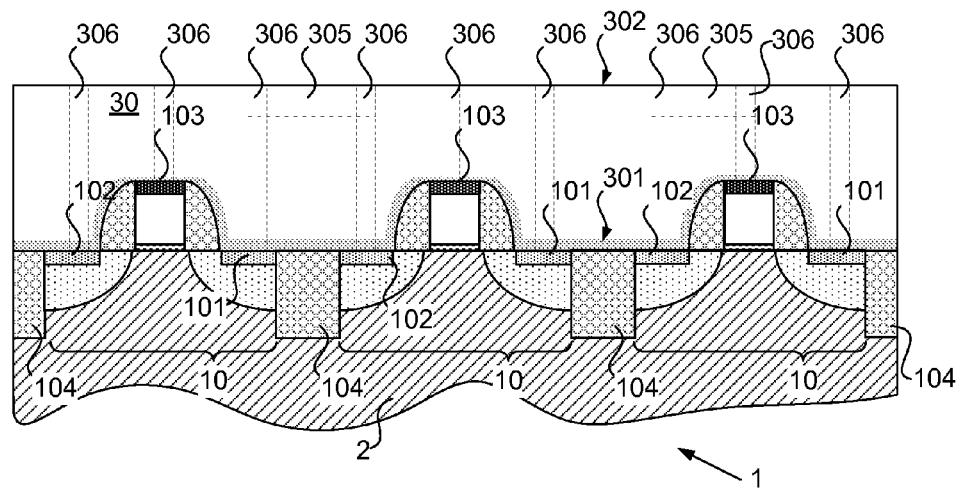
FIG. 2 schematically shows a cross-sectional view of an example of an embodiment of a semiconductor intermediate product which can be subject to an example of a method for manufacturing a semiconductor device.

Referring to FIG. 2, for instance an example of a semiconductor intermediate product 1 is shown after the manufacturing of the actual semiconductor device structures but before the contacts of the semiconductor device structures 10 are connected to each other to form an integrated circuit. As explained below in more detail, the contacts 101-103 may be connected to form an integrated circuit by providing connecting lines between different contacts in a dielectric layer 30.

The example shown in FIG. 2 includes a plurality of semiconductor device structures 10. In this example, the semiconductor device structures 10 are field effect transistor structures, however the semiconductor device structures 10 may also be other device structures, such as for example bipolar transistors, diodes, capacitors, inductors, resistors or other components of an semiconductor integrated circuit.

As shown, the semiconductor device structures 10 are provided on a common substrate 2. The substrate 2 may for example be a semiconductor substrate which may be made from any semiconductor material or combinations of materials, such as silicon-based materials, for example monocrystalline silicon or non-silicon based materials, such as gallium arsenide, silicon germanium, silicon carbide, silicon-on-insulator (SOI), silicon, indium-phosphide, or the like, and combinations of the above. The substrate 2 may for example be a monolayer substrate, for example a monocrystaline silicon substrate, or a multilayer substrate such as a silicon on polysilicon carbide (SopSiC) substrate.

The semiconductor device structures 10 are separated by device separation regions 104. The device separation regions 104 may for example have a doping different from the part of the semiconductor device structures 10 directly adjacent to the device separation regions 104 such as to form a reverse poled diode with the semiconductor device structures 10 and hence inhibiting a current flow through the substrate 2 between the adjacent semiconductor device structures 10.

In the shown example, the semiconductor device structures 10 are covered by a dielectric layer 30. The dielectric layer 30 may be made of an suitable dielectric material. The dielectric material may for example have a dielectric constant K of about 3.9 and be made of undoped, non-porous siliconoxide. However, the dielectric material may also for example be a low-K dielectric, having a dielectric constant K below 3.9, such as 3.5 or lower, for example 3 or lower, such as 2.5 or lower, for example 2.2 or lower, such as 2.0 or lower. The dielectric material may for example be a porous or non-porous material. The dielectric material may for example be (doped or undoped) silicon dioxide, a polymeric dielectric, for example an organic polymeric dielectric (such as polyimide, benzocyclobutene, or polytetrafluoroethylene) or an silicon based polymeric dielectric (such as hydrogen silsesquioxane or methylsilsesquioxane) or the like and combinations of the above. The dielectric layer 30 may for example be formed of a carbon doped silicon dioxide, (which may also be referred to as an organo silicate glass (OSG) or C-oxide). A low-K carbon doped oxide may for example be manufactured using products sold under the name BLACK DIAMOND™ according to conventional Plasma Enhanced Chemical Vapour Deposition (PECVD) processes. In addition, a carbon doped oxide may be produced by PECVD methods using organo-silane precursors such as alkyl substituted cyclo-siloxanes where the dielectric constant may be varied over a range depending on the precursors and process conditions. Also for example spin-on glass (SOG) low-K materials including carbon materials such as SILK™ silsesquioxanes, such as alkyl substituted silsesquioxanes, for example methyl-silsesquioxane (MSQ), may be suitably used to form the dielectric layer 30.

The dielectric layer may be a solid. Alternatively, the dielectric may be a fluid, such as a gas or a mixture of gasses, for example air. For instance, the dielectric layer may be obtained by providing a sacrificial layer, providing and filing the trenches in the sacrificial layer and then removing the sacrificial layer leaving empty space which is filled with the gas or gasses that surround the semiconductor device structure.

In the shown example of a intermediate product, the semiconductor device structures 10 have respective contacts 101-103, e.g. sources/drains 101,102 and gates 103, via which a semiconductor device structure 10 can be connected to other devices on the substrate 2 or outside the substrate 2, to form the desired electrical circuits. For example interconnecting electrically conducting lines which are isolated by insulating dielectrics, such as the dielectric layer 30, may be formed which connect the contacts 101-103 in a desired manner.

As illustrated in FIG. 2, with areas 306 defined by the dashed lines, for example connecting lines, called vias, extending in a direction away from the substrate 2 may be formed. The vias may for example extend from a first surface 301 of the dielectric layer 30 to another, opposite surface 302 of the dielectric layer 30 for example to connect device contacts or lines at the side of the first surface 301 to device contacts or lines at the side of the opposite surface 302.

As indicated with the areas 305 defined by the dash-dotted lines connecting lines, called interconnects, extending in a direction parallel to the surface of the substrate 2 may be formed, which can connect different vias to each other. In the example of FIG. 2, for instance, the interconnects are shown at the surface 302 of the dielectric layer 30 opposite to the device side surface 301.

Figure 3:
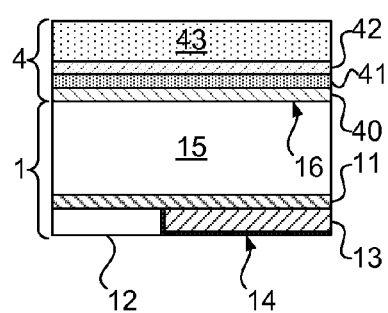
FIGS. 3A-3K schematically show cross-sectional views of an example of an embodiment of a semiconductor intermediate product in different stages of a second example of a method for manufacturing a semiconductor device.
Figure 3:
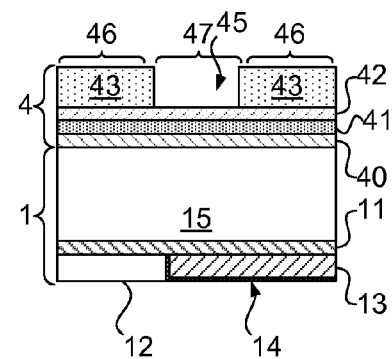
Figure 3:
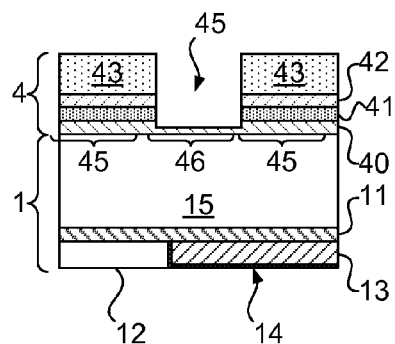
Figure 3:
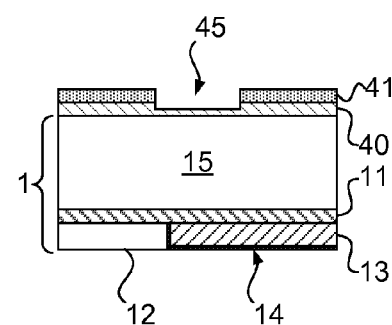
Figure 3:
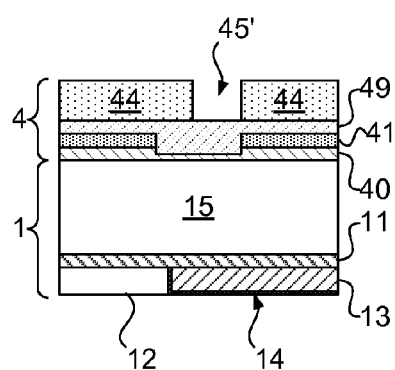
Figure 3:
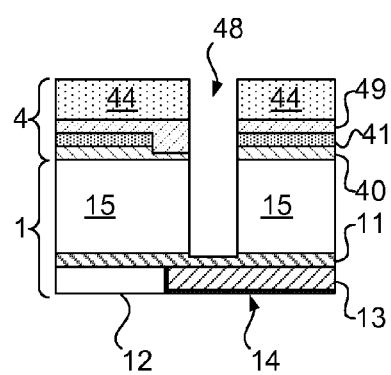
Figure 3:
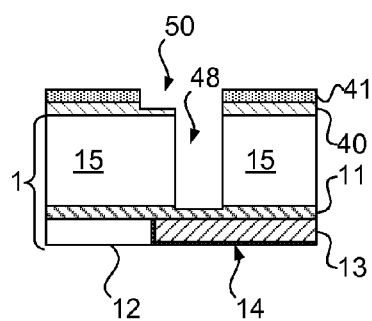
Figure 3:
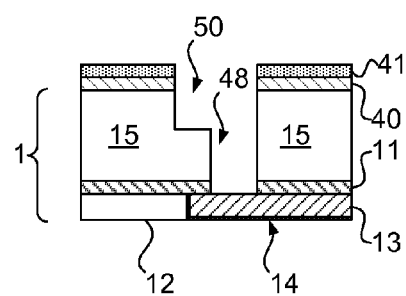
Figure 3:
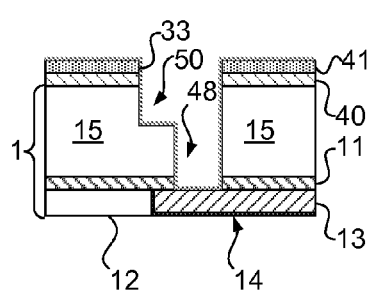
Figure 3:
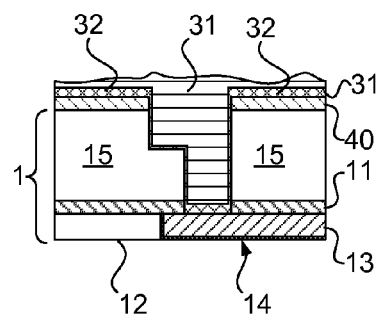
Figure 3:
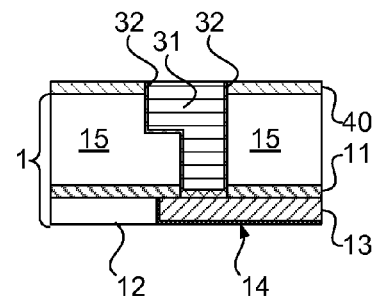

FIGS. 3A-K illustrate a method suitable to form vias and/or interconnects on a semiconductor integrated circuit. FIG. 3 illustrates an interconnect trenches-first dual-damascene method, in which the interconnect patterns are defined (as illustrated in FIG. 3B) before defining the via patterns (as illustrated in FIG. 3E). However, it will be apparent that the interconnects and vias may also be formed using a via-first dual-damascene in which the vias are defined first followed by definition the interconnect trenches or other single or dual damascene process.

The dielectric layer 15 may for example, as explained below in more details be etched to accommodate a dual-damascene (DD) structure in which the interconnects and vias are formed simultaneously, for example in a single step of metal deposition in respective recesses 48,50 formed in the dielectric layer 15 (as illustrated in FIG. 3J). The via trenches 48 and interconnect trenches 50 may be defined by using two lithography steps. As illustrated in FIGS. 3B-3D, first an interconnect pattern may be defined after which the via pattern is defined, as shown in FIG. 3E. After defining the patterns, the trenches 48,50 may be formed corresponding to the defined patterns. As illustrated in FIGS. 3E-F, for example, first a via trench 48 may be formed and thereafter the interconnect trench 50 as is illustrated in FIGS. 3G-H. After the via trenches 48 and the interconnect trenches 50 are etched, the via trenches 48 are filled in the same filling step as the interconnect trenches 50, for example by deposition of a metal (such as copper) or another suitable material, e.g. using physical vapour deposition, chemical vapour deposition, electroplating or another suitable process, as is illustrated in FIGS. 3I-K. The via trenches 48 and the interconnect trenches 50 may for example be filled with a conducting material that will form the contact or interconnect layer 13, such as a metal (for example with copper, aluminium, silver, gold or tungsten or mixtures, compounds or alloys including such materials), a metal nitride or other suitable materials.

As shown in FIG. 3A, a dielectric layer 15 may be present which forms part of a semiconductor intermediate product 1. As shown in the example of FIG. 3A, the dielectric layer 15 may for example be provided on a barrier and/or etch stop layer 11 which, for example prevents the diffusion of material of a contact or interconnect layer 13 into the dielectric layer 15 and/or protects the material below the etch stop layer 11 against undesired etching. As shown, the contact or interconnect layer 13 may be provided in a recess of a lower dielectric layer 12. The barrier layer 11 may extend over the whole surface of the lower dielectric layer 12, thus covering both the lower dielectric layer 12 and the interconnect layer 13. The layer 11 may for example be made from a silicon based compound, such as a silicon nitride, a silicon carbide. The silicon carbide-based barrier material may for example include SiC, SiCH SiCN or SiCO. The barrier layer 11 may also be made of a barrier metal, such as In, Mg, Al, Zr, Ce, Ir, Co, W, Ni, Sn or be made of a material including P, or mixtures, compounds or alloys including such materials. The barrier layer 11 may, as shown in the examples, be a continuous barrier layer which extends over substantial areas outside the areas where the trenches are provide. However, the barrier layer 11 may also be a discontinuous layer provided selectively on the interconnect layer 13 (e.g. in the areas of the trenches. The barrier layer 11 may then be made of, for example Co, W, P, Ni, Mo, Pd, Sn, In, Mg, AL, Zr, Ce, I and their oxides and/or mixtures, compounds or alloys including such materials.

The contact or interconnect layer 13 may be provided on a barrier layer 14 which covers the walls of the recess and which inhibits the migration of the material of the contact or interconnect layer 13 in to the surrounding environment, e.g. in this example into the lower dielectric later 12. The barrier layer 14 may for example be made of Ta, TaN, TiN, W, WN or mixtures, compounds or alloys including such materials, or other suitable barrier material.

As shown in FIG. 3A, the hard-mask layer 41 may be provided on an exposed surface of the layer to be patterned, e.g. the dielectric layer 15. The hard-mask layer 41 may be part of a processing stack 4 which is used to process the dielectric layer 15. During the processing, for example, one or more of the layers 40-42 of the processing stack 4 may be removed, changed or patterned to perform a certain function. For example, a capping layer 40 may be present between the hard-mask layer 41 and the dielectric layer, which covers the upper surface 16 of the dielectric layer 15. The capping layer 40 may be removed locally, for example to enable exposure of the dielectric layer 15 to the processing. The capping layer 40 may protect the dielectric layer 15 in subsequent processing steps, such as during chemical and/or mechanical planarization, photolithographic rework and/or prevent penetration of contaminants, such as moisture, into the dielectric layer 15. The capping layer 40 may be made of any suitable material, for example silicon nitride, silicon oxynitride, silicon carbide (SiC), silicon oxide and the like or combinations thereof. The capping layer 40 may have a density in the range of 1.5 g/cm$^3$ to 2.2 g/cm$^3$, such as 1.9 g/cm$^3$.

The hard-mask layer 41 may be covered with a layer of resist 43 which is used to transfer a pattern onto the hard-mask layer 41, for example using a lithography process, such as photolithography, electron-beam lithography, imprint lithography or other suitable patterning process. An anti-reflective layer 42 may be present between the hard-mask layer 41 and the resist layer 43. The anti-reflective layer 42 may reduce the reflection of radiation to which the resist layer 43 is sensitive, such as ultraviolet electromagnetic radiation, into the resist layer 43. As illustrated in FIG. 3B, the resist layer 43 may be patterned to obtain openings 45 in the resist layer 43 which bare the underlying layers 40-42 of the stack 4 in bared areas 47 and maintain the underlying layers covered in the covered areas 46. The openings 45 define the position and width of the interconnect trenches 50.

As explained above with reference to FIG. 1, the pattern in the resist 43 may then be transferred into the hard-mask layer 41. For example, the hard-mask layer 41 may be removed in the bared areas 47. In this example, the anti-reflective layer 42 and the hard-mask layer 41 may be removed completely in the bared areas 47, while leaving the layers 40-42 intact in the covered areas, as shown in FIG. 3C. In the bared areas, the capping layer 40 may be removed partly, e.g. be reduced in thickness, such that the dielectric layer 15 remains covered by the capping layer 40 in the bared areas 47. The layers 40-42 may for example be (partly) removed by exposing them to a suitable substance, such as an etchant.

As shown in FIGS. 3C and D, after the opening 45 has been extended into the anti-reflective layer 42 and the hard-mask layer 41, the resist layer 43 and the anti-reflective layer 42 may be removed. Thereafter, one or more recesses 48, 50 may be created in the dielectric layer 15. For example one or more via trenches 48 and/or one or more interconnect trench trenches 50 may formed in the dielectric layer 15 in accordance with the pattern(s) defined in the hard-mask 41.

For example, after defining the position and width of the recesses of the interconnect trench trenches 50, the position and width of recesses which will form the via trenches 48, and hence the via pattern, may be defined. For example, a second resist layer 44, and second anti-reflective layer 45, may be provided after removing the resist layer 43 and the anti-reflective layer 42, to form a via recess 48. The second resist layer 44 may be patterned with openings 45' (for example using a lithographic process such as photolithography, electron beam lithography or other suitable process). The bared areas below the opening 45' may be exposed to a suitable substance, such as an etchant to which the resist 44 is resistance but which removes the hard-mask layer 41 and other underlying layers of the processing stack 4 and the dielectric layer 15, as shown in FIG. 3F, thereby forming the via trenches 48. The second resist layer 44 protects the other parts of the layers 15,40,41 below the second resist layer 44 including the parts (as far as covered by the second resist layer 44) of the regions where the interconnect trench openings 45 has been formed so that the via trenches 48 can be etched without further etching the dielectric layer 15 (and the capping layer 40 if present) in the area where the interconnect trenches 50 are to be formed As shown in FIG. 3G, after forming the via trenches 48, the second resist layer 44 and the anti-reflective layer 49 may be removed. The dielectric layer 15 may then be removed below the pattern in the hard-mask layer 41, which defines the interconnects, in order to form the interconnect trenches 50, for example by exposing the dielectric layer in those areas to a substance which removes the dielectric layer 15, such as an etchant. As shown in FIG. 3H, the interconnect trench 50 may partly overlap with the via trench 48 and/or extend less deep into the dielectric layer 15 than the via trench 48. The barrier and/or etch stop layer 11 may also be removed, in order to enable an electrically conducting contact between the contact or interconnect layer 13 and the material in the via trench 48.

As illustrated in FIG. 3I, the hard-mask layer 41 may then be removed, for example by bringing the hard-mask layer 41 in contact with a cleaning agent 33. As shown in FIG. 3I, the cleaning agent 33 may also be brought in contact with the walls of the trenches 48,50. Thereby, contaminants of the trenches, with material from the hard-mask layer 41, may be removed and, accordingly the risk that the compounds in the hard-mask layer 41 affect the performance of the semiconductor device may be reduced. For example, crystals such as fluoride crystals may be removed by a lift-off. As illustrated in FIG. 3J, after removal of the hard-mask layer 41, the trenches 48,50 may be filled with a suitable material 31. As shown in FIG. 3J, before filling the trenches, the walls of the trenches 48,50 may be covered with a layer 32 which acts as a barrier against diffusion of the filling material into the dielectric layer 15. For example the layer 32 may be made from TaN or other suitable barrier material. The filling material 31 may for example be copper or another metal or conducting material.

In the areas where the barrier layer 11 lies bare after forming the trenches 48,50 (e.g. in the area of the via trench in the example of FIG. 3), the barrier layer 11 may be removed, in order to enhance electrical contact between the contact or interconnect layer 13 and the filling material in the via trenches 48. The barrier layer 11 may for example be etched before the application of a cleaning agent 33 or be removed after the cleaning agent has been used so that the contact or interconnect layer 13 is protected against the cleaning agent 33. Moreover, in case the barrier layer 11 is a discontinuous layer, the barrier layer 11 may be left as it is and not be removed.

As illustrated in FIG. 3J, the barrier layer 32 and the filling material layer 31 may be deposited over the entire top surface and, after deposition, the top surface may be planarised to be level with the open side of the trenches 48,50 and/or with the capping layer 40. Thereafter, the semiconductor intermediate product may be finished and for example, further interconnect layers may be provided.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Also, in the shown examples, a single hard-mask layer is shown. However, the hard-mask 41 may also include two or more different layers. The hard-mask may for example include bi-layers of materials (partially) based on the same compounds, such as a metal and a metal nitride, such as Ti/TiN or Ta/TaN bi-layers. The bi-layers may also be combinations of materials based on different compound such as Ti/Al, Ti/TiN/Al. Furthermore, the hard-mask layer may be in contact with the semiconductor device layer to be patterned or be separated there from by one or more intermediate layers, such as in the example of FIG. 3. the cap layer 40.

Furthermore, in the example of FIG. 3, the via trenches and the interconnect trenches are filled simultaneously. However, the via trenches and the interconnect trenches may, alternatively, be formed and/or filled in separate phases. For example, the via trenches may be formed and filled in a dielectric layer after which a second dielectric layer is formed (if desired with intermediate processing, such as planarisation) in which the interconnect trenches are formed and filled.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality.

The terms "upper," "lower," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. The mere fact that certain measures are recited in mutually different claims does not indicate that a combination of these measures cannot be used to advantage.

The invention claimed is:

1. A method for manufacturing a semiconductor device, comprising:
   providing, on an exposed surface of at least one layer to be patterned of a semiconductor intermediate product, a patterned hard-mask layer of a metal or metal compound which covers the exposed surface in covered areas of said at least one layers to be patterned and which patterned hard-mask layer does not cover said exposed surface in bared areas of said at least one layers to be patterned;
   forming at least one recess in said at least one layers to be patterned by at least partially removing said at least one layers to be patterned in the bared areas;
   removing the hard-mask layer using a wet-etchant containing peroxide; and
   filling said recess with a filling material after removing the hard-mask layer.

2. A method as claimed in claim 1, wherein the wet-etchant is heated.

3. A method as claimed in claim 2, wherein the wet-etchant contains 28 volume % of NH4OH and/or 37 volume % of HCl and/or 30 volume of peroxide.

4. A method as claimed in claim 1, wherein the wet-etchant is a wet-etchant containing H2O and one or more of NH4OH and HCl, such as SC1 or SC2.

5. A method as claimed in claim 1, wherein the wet-etchant contains 28 volume % of NH4OH and/or 37 volume % of HCl and/or 30 volume % of peroxide.

6. A method as claimed in claim 5, including removing a barrier layer positioned below the layer to be patterned after removing said hard mask layer at least where said barrier layer lies bare after said forming of said recess, said barrier layer protecting the material below the barrier layer against undesired etching.

7. A method as claimed in claim 1, wherein the wet-etchant contains a dissolution of peroxide, organic residuals, inorganic salts, fluorine salts, corrosion inhibitors, metal complexants, buffers, surfactants and 2-(2-butoxyethoxy)ethanol.

8. A method as claimed in claim 1, wherein the hard-mask layer is made of aluminium, copper, titanium, tantalum, tungsten or analogues, mixtures, compounds and/or alloys thereof.

9. A method as claimed in claim 1, wherein the hard-mask layer is made of a metal-nitride, such as TiN, TaN or HfN, or analogues, mixtures, compounds and/or alloys thereof.

10. A method as claimed in claim 1, further comprising;
    processing, after filling said recess with a filling material, the semiconductor intermediate product to obtain a semiconductor device.

11. A method as claimed in claim 1, wherein said dielectric layer is a low-k dielectric layer with a dielectric constant of 2.5 or lower.

12. A method as claimed in claim 11, wherein said dielectric material is a porous material.

13. A method as claimed in claim 1, wherein said dielectric material is a porous material.

14. A method as claimed in claim 1, including removing a barrier layer positioned below the layer to be patterned after removing said hard mask layer at least where said barrier layer lies bare after said forming of said recess, said barrier layer protecting the material below the barrier layer against undesired etching.

15. A method as claimed in claim 1, wherein said barrier layer is made of a barrier metal of the group consisting of: Co, W, P, Ni, Mo, Pd, Sn, In, Mg, Al, Zr, Ce, Ir or oxides and/or mixtures, compounds or alloys thereof.

16. A method as claimed in claim 14, wherein said material below the barrier layer is copper, aluminium, silver, gold or tungsten or mixtures, compounds or alloys including such materials.

17. A method as claimed in claim 14, wherein the barrier layer is removed after application of a cleaning agent to walls of the recess, for removing contaminants.

18. A method as claimed in claim 1, wherein the wet-etchant is heated to 90° C. or above.

19. A method as claimed in claim 1, wherein said dielectric layer is a low-k dielectric layer with a dielectric constant of 2.2 or lower.

20. A semiconductor device manufactured by a method comprising:
    providing, on an exposed surface of at least one layer to be patterned of a semiconductor intermediate product, a patterned hard-mask layer of a metal or metal compound which covers the exposed surface in covered areas of said at least one layers to be patterned and which patterned hard-mask layer does not cover said exposed surface in bared areas of said at least one layers to be patterned;

forming at least one recess in said at least one layers to be patterned by at least partially removing said at least one layers to be patterned in the bared areas;

removing the hard-mask layer using a wet-etchant containing peroxide; and filling said recess with a filling material after removing the hard-mask layer.

* * * * *